(12) United States Patent
Iwamoto

(10) Patent No.: US 11,257,730 B2
(45) Date of Patent: Feb. 22, 2022

(54) ELECTRONIC COMPONENT MODULE, AND MANUFACTURING METHOD FOR ELECTRONIC COMPONENT MODULE

(71) Applicant: Murata Manufacturing Co., Ltd., Nagaokakyo (JP)

(72) Inventor: Takashi Iwamoto, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 44 days.

(21) Appl. No.: 16/779,710

(22) Filed: Feb. 3, 2020

(65) Prior Publication Data
US 2020/0168520 A1 May 28, 2020

Related U.S. Application Data

(63) Continuation of application No. PCT/JP2018/030183, filed on Aug. 13, 2018.

(30) Foreign Application Priority Data

Aug. 21, 2017 (JP) .......................... JP2017-1558855

(51) Int. Cl.
*H01L 23/31* (2006.01)
*H01L 23/13* (2006.01)
(Continued)

(52) U.S. Cl.
CPC ........ *H01L 23/3121* (2013.01); *H01L 21/565* (2013.01); *H01L 21/568* (2013.01);
(Continued)

(58) Field of Classification Search
None
See application file for complete search history.

(56) References Cited

U.S. PATENT DOCUMENTS

| 6,492,194 B1 * | 12/2002 | Bureau | ............... H01L 23/3135 438/106 |
| 2002/0181614 A1 * | 12/2002 | Mostafa | ............... H04B 1/0025 375/316 |

(Continued)

FOREIGN PATENT DOCUMENTS

| JP | 2005-310954 A | 11/2005 |
| JP | 2013-187434 A | 9/2013 |

OTHER PUBLICATIONS

Official Communication issued in International Patent Application No. PCT/JP2018/030183, dated Oct. 2, 2018.

*Primary Examiner* — Jay C Chang
(74) *Attorney, Agent, or Firm* — Keating & Bennett, LLP

(57) ABSTRACT

An electronic component module includes an electronic component, a resin structure, a wiring portion, and a shield portion. The resin structure covers a second main surface and at least a portion of a side surface of the electronic component. The wiring portion is electrically connected to the electronic component. The shield portion includes a first conductor layer and a second conductor layer. The first conductor layer is spaced away from the electronic component between the electronic component and the resin structure, and has electrical conductivity. The second conductor layer is spaced away from the wiring portion between the wiring portion and the resin structure, and has electrical conductivity. In the shield portion, the first conductor layer and the second conductor layer are integrated.

15 Claims, 11 Drawing Sheets

(51) Int. Cl.
  *H01L 23/552*  (2006.01)
  *H01L 23/00*  (2006.01)
  *H01L 25/11*  (2006.01)
  *H05K 1/02*  (2006.01)
  *H01L 21/56*  (2006.01)

(52) U.S. Cl.
  CPC ............ *H01L 23/13* (2013.01); *H01L 23/552* (2013.01); *H01L 24/04* (2013.01); *H01L 24/96* (2013.01); *H01L 24/97* (2013.01); *H01L 25/117* (2013.01); *H05K 1/0216* (2013.01); *H01L 2224/0401* (2013.01); *H01L 2224/04105* (2013.01); *H01L 2924/3025* (2013.01)

(56) References Cited

U.S. PATENT DOCUMENTS

| | | | |
|---|---|---|---|
| 2012/0062439 A1* | 3/2012 | Liao | H01Q 1/526 343/841 |
| 2012/0153433 A1* | 6/2012 | Yen | H01L 23/66 257/531 |
| 2014/0175623 A1 | 6/2014 | Pagaila et al. | |
| 2016/0130392 A1* | 5/2016 | Hsieh | C08L 63/04 525/438 |
| 2016/0163682 A1 | 6/2016 | Brunnbauer et al. | |
| 2016/0220135 A1* | 8/2016 | Negi | A61B 5/296 |
| 2019/0043810 A1* | 2/2019 | Kapusta | H01L 24/20 |

\* cited by examiner

ELECTRONIC COMPONENT MODULE, AND MANUFACTURING METHOD FOR ELECTRONIC COMPONENT MODULE

CROSS REFERENCE TO RELATED APPLICATIONS

This application claims the benefit of priority to Japanese Patent Application No. 2017-158855 filed on Aug. 21, 2017 and is a Continuation Application of PCT Application No. PCT/JP2018/030183 filed on Aug. 13, 2018. The entire contents of each application are hereby incorporated herein by reference.

BACKGROUND OF THE INVENTION

1. Field of the Invention

The present invention relates to an electronic component module, and a manufacturing method for an electronic component module and, more specifically, to an electronic component module including an electronic component and a resin structure, and a manufacturing method for an electronic component module.

2. Description of the Related Art

Hitherto, a semiconductor package including a semiconductor chip (electronic component), an electrically insulating resin layer (resin structure), electrically conductive posts (through-wires), connection terminals, wiring layers, and a surface layer is known as an electronic component module (see, for example, Japanese Unexamined Patent Application Publication No. 2005-310954).

In the semiconductor package described in Japanese Unexamined Patent Application Publication No. 2005-310954, the connection terminals are provided on a top surface of the semiconductor chip, and the whole of the semiconductor chip except a bottom surface portion, the connection terminals on the semiconductor chip, the electrically conductive posts, and the wiring layers are covered with the electrically insulating resin layer.

However, with an existing electronic component module as in the case of the semiconductor package described in Japanese Unexamined Patent Application Publication No. 2005-310954, there is a problem in that, for example, the electronic component or the wiring layers are susceptible to electromagnetic waves from the outside. Thus, with the existing electronic component module described in Japanese Unexamined Patent Application Publication No. 2005-310954, there is a high possibility that characteristics will be degraded.

To solve the above problem, the inventors of preferred embodiments of the present invention conceived an electronic component module having a structure such that a first conductor layer is provided between the electronic component and the resin structure and a second conductor layer is provided between the wiring layers and the resin structure.

However, since an interface is located at a boundary between the first conductor layer and the second conductor layer, degradation of electromagnetic shielding performance to block electromagnetic waves from the outside is significant even with the electronic component module having the above-described structure.

SUMMARY OF THE INVENTION

Preferred embodiments of the present invention provide electronic component modules that are each able to reduce or prevent degradation of electromagnetic shielding performance to block electromagnetic waves from the outside, and manufacturing methods for such electronic component modules.

An electronic component module according to a preferred embodiment of the present invention includes an electronic component, a resin structure, a wiring portion, and a shield portion. The electronic component includes a first main surface and a second main surface opposed to each other, and a side surface connecting the first main surface and the second main surface. The resin structure covers the second main surface and at least a portion of the side surface of the electronic component. The wiring portion is electrically connected to the electronic component. The shield portion includes a first conductor layer and a second conductor layer. The first conductor layer is spaced away from the electronic component between the electronic component and the resin structure, and has an electrical conductivity. The second conductor layer is spaced away from the wiring portion between the wiring portion and the resin structure, and has an electrical conductivity. In the shield portion, the first conductor layer and the second conductor layer are integrated.

A manufacturing method for an electronic component module according to a preferred embodiment of the present invention includes a component disposing process, an intermediate portion forming process, and a resin molding process. In the component disposing process, an electronic component is disposed on a surface of a support such that a first main surface of the electronic component faces the surface of the support. The electronic component includes the first main surface and a second main surface opposed to each other, and a side surface connecting the first main surface and the second main surface. In the intermediate portion forming process, an intermediate portion covering an exposed region of the surface of the support and both of the second main surface and an exposed region of the side surface of the electronic component is formed. In the shield portion forming process, a shield portion covering the intermediate portion is formed. In the resin molding process, a resin structure covering the shield portion is molded.

With the electronic component modules and the manufacturing methods for electronic component modules according to preferred embodiments of the present invention, degradation of electromagnetic shielding performance to block electromagnetic waves from the outside is reduced or prevented.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1A:
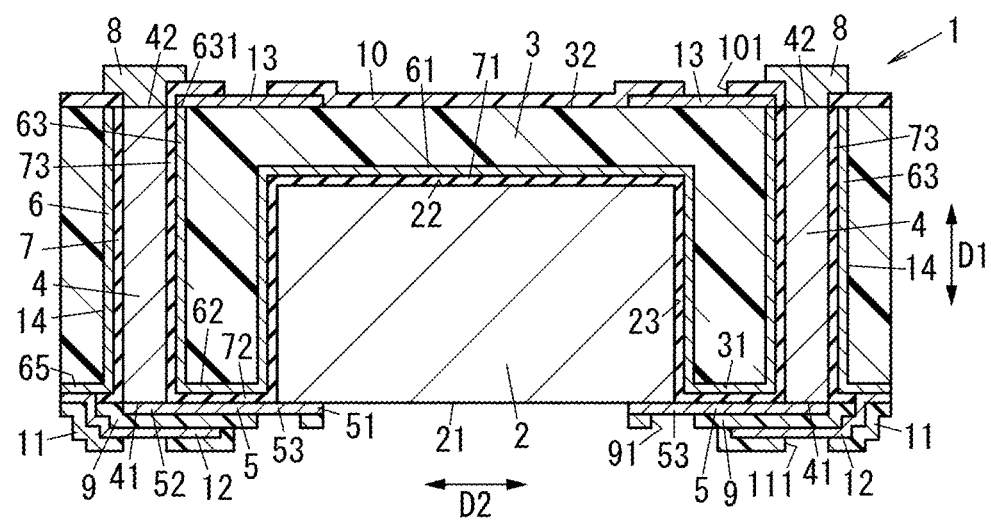
FIG. 1A is a cross-sectional view of an electronic component module according to a first preferred embodiment of the present invention.
Figure 1B:
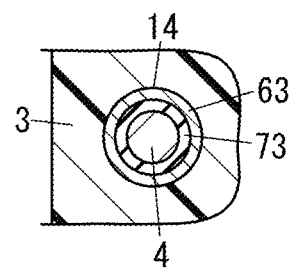
FIG. 1B is an enlarged view of a relevant portion including a coaxial structure in a cross section perpendicular or substantially perpendicular to a thickness direction of the electronic component module.

Hereinafter, electronic component modules according to preferred embodiments will be described with reference to the drawings.

FIGS. 1A and 1B, FIG. 2, FIGS. 3A to 3C, FIGS. 4A to 4F, FIGS. 5A to 5D, FIG. 6 to FIG. 10, FIGS. 11A to 11D, and FIGS. 12A to 12D that will be referred to in the following preferred embodiments, and the like, are all schematic diagrams, and the ratios of the sizes and thicknesses of elements in the drawings do not always reflect actual scale ratios.

First Preferred Embodiment (1) General Configuration of Electronic Component Module Hereinafter, an electronic component module 1 according to a first preferred embodiment of the present invention will be described with reference to the drawings.

As shown in FIG. 1A, the electronic component module according to the first preferred embodiment includes an electronic component 2, a resin structure 3, a plurality of (two in the illustrated example) through-wires 4, a plurality of (two in the illustrated example) wiring layers (wiring portions) 5, an electrically conductive shield portion 6, and an electrically insulating portion (intermediate portion) 7 having an electrically insulating property. In the electronic component module 1, the resin structure 3 holds the electronic component 2 and the through-wires 4. In the electronic component module 1, the resin structure 3 protects the electronic component 2 against impact, or the like, from the outside. The through-wires 4 are located to the sides of the electronic component 2 and extend through the resin structure 3 in a thickness direction (predetermined direction) of the resin structure 3. The wiring layers 5 each electrically connect the electronic component 2 and an associated one of the through-wires 4.

The electronic component module 1 further includes a plurality of (two in the illustrated example) electrodes 8, first resist layers 9, a second resist layer 10, third resist layers 11, first grounding wiring layers 12, second grounding wiring layers 13, and a plurality of (two in the illustrated example) electrodes 53. The plurality of (two in the illustrated example) electrodes 8 and the plurality of (two in the illustrated example) electrodes 53 are external connection electrodes.

Figure 2:
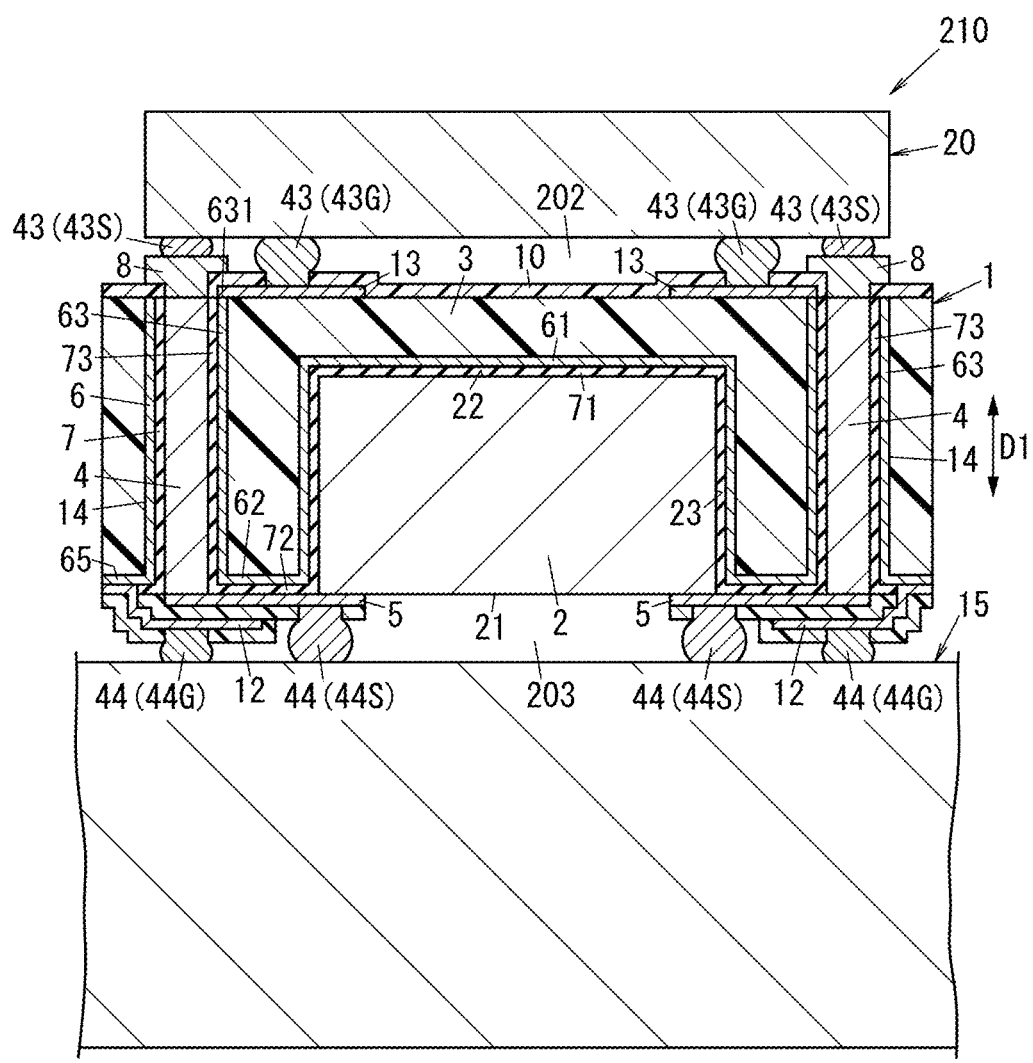
FIG. 2 is a cross-sectional view of a communication module including an electronic component module using the electronic component module shown in FIG. 1A as an interposer.

The electronic component module 1 may preferably be, for example, used as an interposer to be interposed between another electronic component 20 (see FIG. 2) and a circuit board 15 (see FIG. 2). The circuit board 15 is preferably, for example, a printed circuit board.

(2) Elements of Electronic Component Module

Next, the elements of the electronic component module 1 will be described with reference to the drawings.

(2.1) Electronic Component

As shown in FIG. 1A, the electronic component 2 includes a front surface (first main surface) 21 and a back surface (second main surface) 22 that are on opposite sides in a first direction D1 of the electronic component module 1. More specifically, the electronic component 2 is preferably a chip electronic component, having a planar shape, and including the front surface 21 and the back surface 22 that are on opposite sides in the thickness direction. The front surface 21 and the back surface 22 are opposed to each other. The electronic component 2 also includes a side surface 23. The side surface 23 connects the front surface 21 and the back surface 22. The plan-view shape of the electronic component 2 (the outer peripheral shape of the electronic component 2 when viewed in the thickness direction) is a rectangular or substantially rectangular shape. However, the shape is not limited to a rectangular or substantially rectangular shape and may be, for example, a square or substantially square shape.

The electronic component 2 is preferably, for example, a radio-frequency device having a frequency band of about 1 GHz or higher. A radio-frequency device having a frequency band of about 1 GHz or higher is, for example, a near-field communication device or millimeter-wave device having a frequency band of about 1 GHz or higher. More specifically, the radio-frequency device is preferably, for example, an SAW (surface acoustic wave) filter.

As the frequency increases, the wave length gets shorter, and a problem that an electrical signal transmits (radiates) by using a small conductor as an antenna, that is, a radio interference problem (signal transmission problem) occurs. Particularly, when the frequency band is higher than or equal to about 1 GHz, an electrical signal radiates via a circuit in an electronic device (radio-frequency device) or a wire of an external circuit, and the above problem worsens. In other words, when the frequency band is higher than or equal to about 1 GHz, an extremely advantageous effect is obtained. In addition, when the frequency band is higher than or equal to about 5 GHz, an even better advantageous effect is obtained.

When the electronic component 2 is an SAW filter, the electronic component 2, for example, includes a piezoelectric substrate including a front surface (first main surface) and a back surface (second main surface) that are on opposite sides in the thickness direction, and a functional portion provided on the front surface of the piezoelectric substrate. The piezoelectric substrate is preferably, for example, an LiTaO$_3$ substrate or an LiNbO$_3$ substrate. The thickness of the piezoelectric substrate is preferably, for example, about 200 μm. The functional portion includes, for example, one or plurality of IDT (interdigital transducer) electrodes. The functional portion may include a terminal electrode(s) for external connection. The number of the terminal electrodes may be one or more. When the electronic component 2 is an SAW filter, the front surface 21 of the electronic component 2 includes, for example, an exposed portion of the front surface of the piezoelectric substrate and an exposed surface in the functional portion. When the electronic component 2 is an SAW filter, the electronic component 2 is not limited to a configuration including a bulk piezoelectric substrate and may have, for example, a multilayer structure in which a silicon substrate, a silicon oxide film, and a piezoelectric thin film are laminated in this order and a configuration in which the functional portion (an interdigital transducer electrode, a terminal electrode, and the like) is provided on the piezoelectric thin film. The piezoelectric thin film is preferably, for example, an LiTaO$_3$ thin film or an LiNbO$_3$ thin film. The thickness of the piezoelectric thin film is preferably, for example, less than or equal to about 3.5λ where the wave length of acoustic waves, which is determined by the electrode finger pitch of the interdigital transducer electrode, is λ. The thickness of the piezoelectric thin film is preferably, for example, about 0.5 μm. The thickness of the silicon oxide film is preferably, for example, less than or equal to 2.0λ. The thickness of the silicon oxide film is preferably, for example, about 0.5 μm. The thickness of the multilayer structure is preferably, for example, about 200 μm.

The radio-frequency device is not limited to an SAW filter and may be, for example, a BAW (bulk acoustic wave) filter, a dielectric filter, an antenna, a switch, a power amplifier, or the like. The above-described other electronic component 20 is preferably, for example, an IC (integrated circuit). The electronic component 20 is not limited to an IC and may be, for example, an inductor, a capacitor, or an SAW filter. In a communication module 210 (see FIG. 2) including the electronic component module 1, a gap 202 (see FIG. 2) is provided between the electronic component module 1 and the other electronic component 20. In the communication module 210, a gap 203 is provided between the electronic component module 1 and the circuit board 15. Also, in the communication module 210, the electronic component module 1 is electrically connected to the electronic component 20 by a plurality of (four in the illustrated example) electrically conductive bumps 43, and is electrically connected to the circuit board 15 by a plurality of (four in the illustrated example) electrically conductive bumps 44.

(2.2) Resin Structure

As shown in FIG. 1A, the resin structure 3 holds the electronic component 2. The resin structure 3 includes the first surface 31 and the second surface 32 that are on opposite sides in the first direction D1 of the electronic component module 1. More specifically, the resin structure 3 has a planar shape and includes the first surface 31 and the second surface 32 that are on opposite sides in the thickness direction. The plan-view shape of the resin structure 3 (the outer peripheral shape of the resin structure 3 when viewed in the thickness direction, that is, the first direction D1) is a rectangular or substantially rectangular shape. However, the plan-view shape of the resin structure 3 is not limited to a rectangular or substantially rectangular shape and may be, for example, a square or substantially square shape. The size of the resin structure 3 in plan is greater than the size of the electronic component 2 in plan.

The resin structure 3 covers the back surface 22 and a portion of the side surface 23 of the electronic component 2 via the shield portion 6 and the electrically insulating portion 7. In other words, the electronic component 2 is disposed inside the resin structure 3. The resin structure 3 holds the electronic component 2 in a state where the front surface 21 of the electronic component 2 is exposed.

The resin structure 3 is made from a resin having an electrically insulating property, or the like. The resin structure 3, for example, preferably includes a filter mixed with resin in addition to the resin. However, the filler is not an indispensable element. The resin is preferably, for example, epoxy resin. However, the resin is not limited to epoxy resin and may be, for example, acrylic resin, urethane resin, or silicone resin. The filler is preferably, for example, an inorganic filler, such as silica and alumina. The resin structure 3 may include, for example, black pigment, such as carbon black, in addition to the resin and the filler.

(2.3) Through-Wire

As shown in FIG. 1A, in the electronic component module 1, the plurality of (two in the illustrated example) through-wires 4 are disposed to the sides of the electronic component 2. In a second direction D2 perpendicular or substantially perpendicular to the first direction D1, the plurality of through-wires 4 are spaced away from the electronic component 2. The plurality of through-wires 4 are held by the resin structure 3.

Each through-wire 4 has a columnar shape and includes a first end surface 41 and a second end surface 42 that are on opposite sides in a direction parallel or substantially parallel to the thickness direction of the resin structure 3. In short, each through-wire 4 includes the first end surface 41 and the second end surface 42 that are on opposite sides in the first direction D1. A second end 52 of the wiring layer 5 (described later) is laminated on the first end surface 41 of the through-wire 4. Thus, in the electronic component module 1, each through-wire 4 and an associated one of the wiring layers 5 are electrically connected.

In the electronic component module 1, each through-wire 4 is electrically connected to the electronic component 2 via the associated wiring layer 5. In the electronic component module 1, the position and number of the through-wires 4 are not limited.

The material of the through-wires 4 is, for example, a metal. In the electronic component module 1 according to the first preferred embodiment, the material of the through-wires 4 is preferably, for example, Cu. The material of the through-wires 4 is not limited to Cu and may be, for example, Ni. The material of the through-wires 4 is not limited to a metal and may be an alloy.

(2.4) Wiring Layer

Each wiring layer 5 electrically connects the electronic component 2 and an associated one of the through-wires 4 on the first surface 31 side of the resin structure 3 and on the front surface 21 side of the electronic component 2. The wiring layer 5 includes the first end 51 connected to (the surface of the terminal electrode of) the front surface 21 of the electronic component 2 and the second end 52 connected to the through-wire 4. The wiring layer 5 is disposed over the front surface 21 of the electronic component 2, the first end surface 41 of the through-wire 4, and a second intermediate layer 72 of the electrically insulating portion 7 (described later).

The material of the wiring layers 5 is, for example, a metal. In the electronic component module 1 according to the first preferred embodiment, the material of the wiring layers 5 is preferably Cu as one example. In short, the wiring layers 5 are Cu layers. The material of the wiring layers 5 may be, for example, an alloy. Each wiring layer 5 is not limited to a monolayer structure and may have a multilayer structure in which a plurality of layers is laminated.

(2.5) Electrode

Each electrode 8 is provided over the second end surface 42 of the through-wire 4 and the resist layer 10 on the second surface 32 side of the resin structure 3.

The material of the electrodes 8 is, for example, a metal. In the electronic component module 1 according to the first preferred embodiment, the material of the electrodes 8, as well as the wiring layers 5, is preferably Cu as an example. As in the case of the wiring layers 5, each electrode 8 is not limited to a monolayer structure and may have a multilayer structure in which a plurality of layers is laminated.

In the electronic component module 1, a portion of the wiring layer 5 (a portion of the wiring layer 5, not covered with the first resist layer 9) is an external connection electrode 53 to electrically connect the through-wire 4 to the circuit board 15 (see FIG. 2), or the like. In the electronic component module 1, an electrode may be provided on the wiring layer 5. The electrode that is provided on the wiring layer 5 is preferably, for example, a multilayer film of a Ti film on the wiring layer 5 and an Au film on the Ti film. The multilayer structure of the electrode is only illustrative and is not limited to this example.

(2.6) First Resist Layer, Second Resist Layer, and Third Resist Layer

The first resist layers 9 are each provided on the first surface 31 side of the resin structure 3 so as to cover an associated one of the wiring layers 5 except a portion of the wiring layers 5. A hole 91 to expose a portion of the wiring layer 5 is provided in each first resist layer 9. The first resist layers 9 are each provided on the first surface 31 side of the resin structure 3 over the wiring layer 5 and the electrically insulating portion 7. The first resist layers 9 each have an electrically insulating property. The first resist layers 9 are made of a material having a lower solder wettability than the wiring layers 5. The first resist layers 9 are preferably, for example, polyimide layers.

The second resist layer 10 is provided on the second surface 32 side of the resin structure 3 so as to cover the second grounding wiring layers 13. Here, the second resist layer 10 is provided over the second grounding wiring layers 13 and the second surface 32 of the resin structure 3. The second resist layer 10 covers the second grounding wiring layers 13 except a portion of the second grounding wiring layers 13. A hole 101 to expose a portion of the second grounding wiring layer 13 is provided in the second resist layer 10. The second resist layer 10 has an electrically insulating property. The second resist layer 10 is made of a material having a lower solder wettability than the second grounding wiring layers 13. The second resist layer 10 is preferably, for example, a polyimide layer.

The third resist layers 11 are each provided on the first surface 31 side of the resin structure 3 so as to cover an associated one of the first grounding wiring layers 12 except a portion of the first grounding wiring layers 12. A hole 111 to expose a portion of the first grounding wiring layer 12 is provided in each third resist layer 11. The third resist layers 11 each have an electrically insulating property. The third resist layers 11 are made of a material having a lower solder wettability than the first grounding wiring layers 12. The third resist layers 11 are preferably, for example, polyimide layers.

(2.7) Electrically Insulating Portion

The electrically insulating portion 7 has an electrically insulating property. The electrically insulating portion 7 includes a first intermediate layer (first electrically insulating portion) 71, a second intermediate layer (second electrically insulating portion) 72, and a plurality of (two in the illustrated example) third intermediate layers (third electrically insulating portions) 73.

The first intermediate layer 71 is provided in contact with the electronic component 2. More specifically, the first intermediate layer 71 covers the back surface 22 and side surface 23 of the electronic component 2. The second intermediate layer 72 is provided along the first surface 31 of the resin structure 3 in contact with the wiring layers 5 and the shield portion 6. The second intermediate layer 72 electrically insulates the wiring layers 5 and the shield portion 6 from each other. Each third intermediate layer 73 covers the entire or substantially the entire side surface of an associated one of the columnar through-wires 4. The shape of each third intermediate layer 73 is preferably a cylindrical or substantially cylindrical shape. Each third intermediate layer 73 is provided in contact with the associated through-wire 4. The first intermediate layer 71, the second intermediate layer 72, and the plurality of third intermediate layers 73 are integrally provided. The first intermediate layer 71, the second intermediate layer 72, and the plurality of third intermediate layers 73 are formed substantially at the same time in one process from the same material.

In the electronic component module 1, the dielectric constant and dielectric loss tangent of the electrically insulating portion 7 are respectively less than the dielectric constant and dielectric loss tangent of the resin structure 3. Also, in the electronic component module 1, the dielectric constant and dielectric loss tangent of the electrically insulating portion 7 are respectively less than the dielectric constant and dielectric loss tangent of a base material (in the case of an SAW filter, for example, a piezoelectric substrate) supporting the functional portion in the electronic component 2. The electrically insulating portion 7 is defined by an inorganic electrically insulating film. The inorganic electrically insulating film is made of an inorganic electrically insulating material. The inorganic electrically insulating material that is used for the electrically insulating film is preferably, for example, silicon oxide. The electrically insulating portion 7 is not limited to an inorganic electrically insulating film and may be an organic electrically insulating film. The material of the organic electrically insulating film is, for example, a fluorine-based resin, bismaleimide, benzocyclobutene, polyimide, or the like.

(2.8) Shield Portion

The shield portion 6 is provided as a shield layer for electromagnetic shielding. The shield portion 6 includes a first conductor layer 61, a second conductor layer 62, and a plurality of (two in the illustrated example) third conductor layers 63.

The first conductor layer 61 is provided along the side surface 23 and back surface 22 of the electronic component in contact with the resin structure 3 and the first intermediate layer 71. The second conductor layer 62 is provided along the first surface 31 of the resin structure 3 in contact with the resin structure 3 and the second intermediate layer 72. Each third conductor layer 63 covers the entire or substantially entire side surface of an associated one of the third intermediate layers 73. The shape of each third conductor layer 63 is preferably a cylindrical or substantially cylindrical shape. Each third conductor layer 63 is in contact with the third intermediate layer 73 and the resin structure 3. The first conductor layer 61, the second conductor layer 62, and the plurality of third conductor layers 63 are integrated. The first conductor layer 61, the second conductor layer 62, and the plurality of third conductor layers 63 are integrally formed substantially at the same time in one process from the same material.

(2.9) Coaxial Structure

In the electronic component module 1, each third conductor layer 63 is disposed coaxially with an associated one of the through-wires 4 so as to surround the side surface of the through-wire 4. In other words, the electronic component module 1 has coaxial structures 14 each including the through-wire 4 and the third conductor layer 63. In the electronic component module 1, each coaxial structure 14 further includes the third intermediate layer 73 interposed between the through-wire 4 and the third conductor layer 63. In the electronic component module 1, the resin structure 3 covers the side surface of each third conductor layer 63.

(2.10) First Grounding Wiring Layer and Second Grounding Wiring Layer

The first grounding wiring layer 12 is electrically connected to the shield portion 6. More specifically, the first grounding wiring layers 12 are each in contact with the shield portion 6 and electrically connected to the third conductor layers 63 on the first surface 31 side of the resin structure 3. The first grounding wiring layers 12 each are provided over the associated first resist layer 9 and a grounding conductor layer 65 on a side across the third conductor layer 63 from the second conductor layer 62 in the shield portion 6. The material of the first grounding wiring layers 12 is preferably, for example, Cu.

The second grounding wiring layers 13 are electrically connected to the shield portion 6. More specifically, the second grounding wiring layers 13 are each in contact with an associated one of the third conductor layers 63 of the shield portion 6 and each are electrically connected to an associated one of the third conductor layers 63 on the second surface 32 side of the resin structure 3. The second grounding wiring layers 13 each are provided over the second surface 32 of the resin structure 3 and an end surface 631 on an opposite side of the third conductor layer 63 from the second conductor layer 62 side. The material of the second grounding wiring layers 13 is preferably, for example, Cu.

(3) Manufacturing Method for Electronic Component Module

Next, a non-limiting example of a manufacturing method for the electronic component module 1 according to the first preferred embodiment will be described with reference to FIGS. 3A to 3F, FIGS. 4A to 4F, and FIGS. 5A to 5D.

In the manufacturing method for the electronic component module 1, after the electronic component 2 is prepared, a first process to an eleventh process are performed sequentially. As described above, the electronic component 2 includes the front surface (first main surface) 21 and the back surface (second main surface) 22 opposed to each other, and the side surface 23 connecting the front surface 21 and the back surface 22 (see FIG. 1A).

Figure 3A:
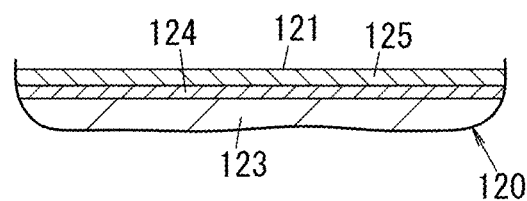
FIGS. 3A to 3C are process cross-sectional views for illustrating a manufacturing method for the electronic component module shown in FIG. 1A.

In the first process, as shown in FIG. 3A, a support 120 is prepared. The support 120 includes a planar base 123, and an electrically conductive layer 125 bonded to one surface of the base 123 in the thickness direction by an adhesion layer 124.

Figure 3B:
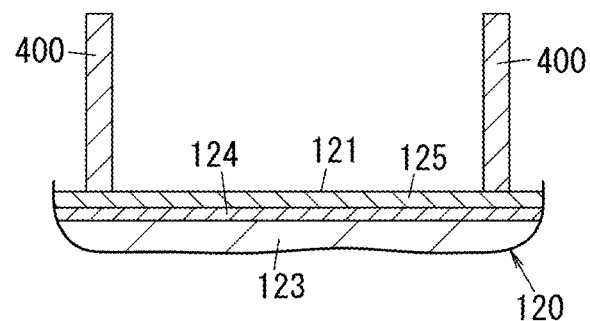

In the second process, as shown in FIG. 3B, the plurality of pillars 400 is formed on the electrically conductive layer 125 of the support 120. The plurality of pillars 400 have electrical conductivity and define the plurality of through-wires 4. In this process, first, a positive photoresist layer that covers the electrically conductive layer 125 of the support 120 is formed. After that, portions of the electrically conductive layer 125, which will be beds for the pillars 400, are exposed by removing portions at positions where the pillars 400 will be formed in the photoresist layer by using a photolithography technique (forming hole portions at positions where the pillars 400 will be formed). After that, the pillars 400 are formed by electrolytic plating. In forming the pillars 400, the pillars 400 are deposited from the exposed surfaces of the electrically conductive layer 125 along the thickness direction of the photoresist layer by passing current between an anode opposed to the surface of the photoresist layer via a plating solution including copper sulfate and a cathode made of the electrically conductive layer 125. After that, the photoresist layer is removed. In the manufacturing method for the electronic component module 1 according to the first preferred embodiment, the second process is a pillar forming process of forming the pillars 400 having electrical conductivity on the surface 121 of the support 120. The surface 121 of the support 120 is the surface of the electrically conductive layer 125.

Figure 3C:
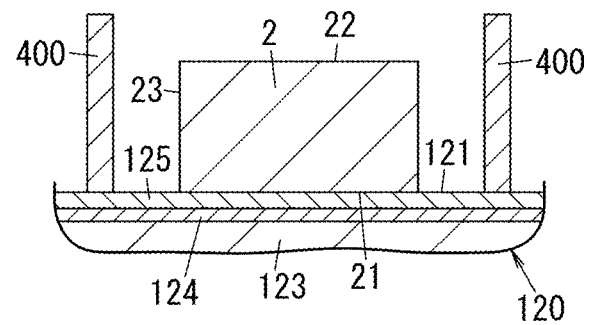

In the third process, as shown in FIG. 3C, the electronic component 2 is temporarily fixed on the electrically conductive layer 125 of the support 120, on which the pillars 400 are formed. More specifically, first, a liquid (pasty) resin adhesion layer (not shown) is formed on the electrically conductive layer 125. Subsequently, the front surface 21 of the electronic component 2 faces the resin adhesion layer, and the electronic component 2 is pressed against the resin adhesion layer. Thus, in the third process, the electronic component 2 is temporarily fixed to the electrically conductive layer 125 via the resin adhesion layer. The resin adhesion layer is preferably formed by a photosensitive positive resist, for example. In the manufacturing method for the electronic component module 1 according to the first preferred embodiment, the third process is a component disposing process. In other words, in the component disposing process, the electronic component 2 is disposed on the surface 121 of the support 120 (temporarily fixed on the support 120) at a position spaced away from the side surfaces of the pillars 400. Here, in the component disposing process, the electronic component 2 is disposed on the surface 121 of the support 120 such that the front surface 21 of the electronic component 2 faces the surface 121 of the support 120.

Figure 4A:
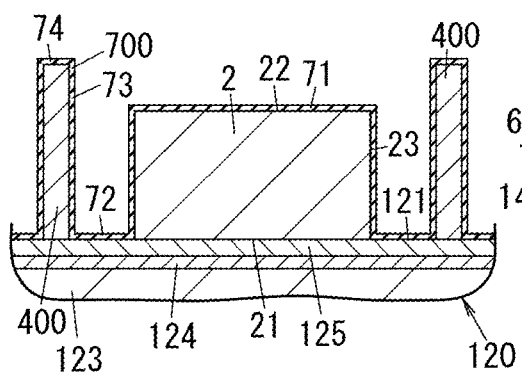
FIGS. 4A to 4F are process cross-sectional views for illustrating a manufacturing method for the electronic component module shown in FIG. 1A.

In the fourth process, as shown in FIG. 4A, an electrically insulating layer 700 that defines the electrically insulating portion 7 (see FIG. 1A) is formed. More specifically, in the fourth process, the electrically insulating layer 700 that covers the exposed portion of the surface 121 of the support 120, the side surfaces and distal end surfaces of the pillars 400, and the side surface 23 and back surface 22 of the electronic component 2 is formed. The electrically insulating layer 700 includes fourth intermediate layers 74 each covering the distal end surface of the pillar 400, in addition to the first intermediate layer 71, the second intermediate layer 72, and the third intermediate layers 73. The material of the electrically insulating layer 700 is preferably, for example, silicon oxide. In the fourth process, the electrically insulating layer 700 is formed by, for example, CVD (chemical vapor deposition). Thus, in the fourth process, the first intermediate layer 71, the second intermediate layer 72, the third intermediate layers 73, and the fourth intermediate layers 74 can be integrally formed. In the fourth process, the first intermediate layer 71, the second intermediate layer 72, the third intermediate layers 73, and the fourth intermediate layers 74 are integrally formed by forming the first intermediate layer 71, the second intermediate layer 72, the third intermediate layers 73, and the fourth intermediate layers 74 substantially at the same time in one process from the same material. In the fourth process, not limited to CVD, the electrically insulating layer 700 may be formed by, for example, spray coating, or the like. In the manufacturing method for the electronic component module 1 according to the first preferred embodiment, the fourth process is an intermediate portion forming process of forming the electrically insulating portion 7 (intermediate portion) covering the side surfaces of the pillars 400.

Figure 4D:
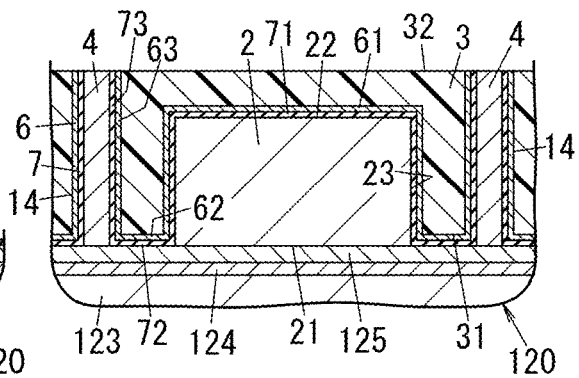
Figure 4B:
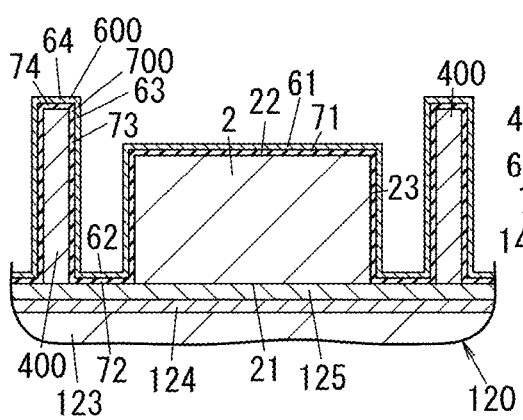

In the fifth process, as shown in FIG. 4B, a metal layer 600 that defines the shield portion 6 (see FIG. 1A) is formed. More specifically, in the fifth process, the metal layer 600 is formed on the electrically insulating layer 700. The metal layer 600 includes fourth conductor layers 64 in addition to the first conductor layer 61, the second conductor layer 62, and the third conductor layers 63. Each fourth conductor layer 64 is formed so as to cover an associated one of the fourth intermediate layers 74. The material of the metal layer 600 is preferably, for example, Cu. In the fifth process, the metal layer 600 is formed by, for example, CVD. Thus, in the fifth process, the first conductor layer 61, the second conductor layer 62, the third conductor layers 63, and the fourth conductor layers 64 can be integrally formed. In the fifth process, the first conductor layer 61, the second conductor layer 62, the third conductor layers 63, and the fourth conductor layers 64 are integrally formed by forming the first conductor layer 61, the second conductor layer 62, the third conductor layers 63, and the fourth conductor layers 64 substantially at the same time in one process from the same material. In the fifth process, not limited to CVD, the metal layer 600 may be formed by, for example, sputtering (for example, oblique sputtering), evaporation (for example, oblique evaporation), spray coating, electroless plating, or the like. In the manufacturing method for the electronic component module 1 according to the first preferred embodiment, the fifth process is a shield portion forming process of forming the shield portion 6 covering the electrically insulating portion 7 (intermediate portion).

Figure 4E:
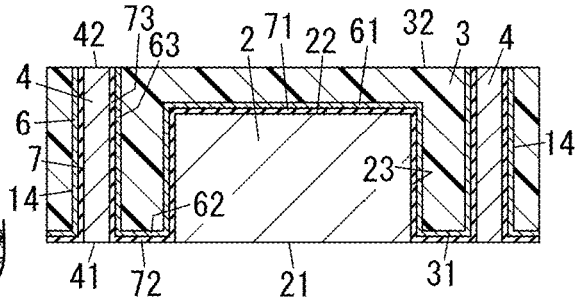
Figure 4C:
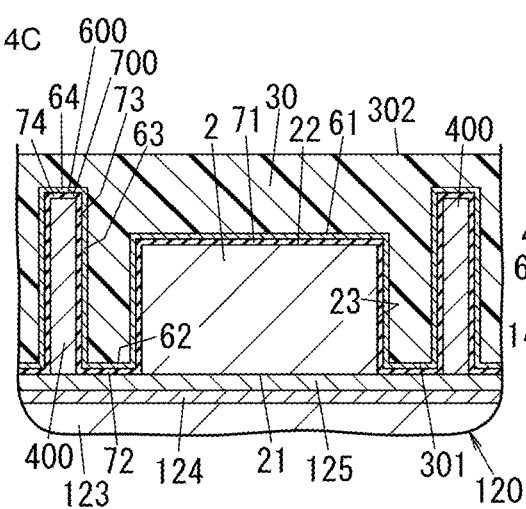

In the sixth process, as shown in FIG. 4C, a resin structure layer 30 that defines the resin structure 3 (see FIG. 4D) is formed on the support 120. Here, in the sixth process, the resin structure layer 30 is formed on the support 120 so as to cover the metal layer 600 covering the electrically insulating layer 700. In short, in the sixth process, the resin structure layer 30 is formed on the electrically conductive layer 125 of the support 120 via the electrically insulating portion 7 and the metal layer 600. Here, the resin structure layer 30 includes a first surface 301 and a second surface 302 that are on opposite sides in the thickness direction. The first surface 301 of the resin structure layer 30 is a surface that contacts the second conductor layer 62 of the metal layer 600. The resin structure layer 30 covers the back surface 22 and side surface 23 of the electronic component 2 via the metal layer 600 and the electrically insulating layer 700. Furthermore, the resin structure layer 30 covers the side surfaces and distal end surfaces of the pillars 400 via the metal layer 600 and the electrically insulating layer 700. Therefore, the resin structure layer 30 is thicker than the resin structure 3, and a portion of the resin structure layer 30, a portion of the metal layer 600, and a portion of the electrically insulating layer 700 are interposed between the second surface 302 of the resin structure layer 30 and the distal end surfaces of the pillars 400.

In the sixth process, the resin structure layer 30 is molded by press molding. A method of forming the resin structure layer 30 is not limited to press molding. In the sixth process, the resin structure layer 30 may be molded by using, for example, spin coating, transfer molding, or the like. In the manufacturing method for the electronic component module 1 according to the first preferred embodiment, the sixth process is a resin molding process of molding the resin structure layer 30 covering the shield portion 6.

In the seventh process, as shown in FIG. 4D, the resin structure 3 is formed by grinding the resin structure layer 30 from the second surface 302 side opposite from the first surface 301 until the thickness of the resin structure 3 is obtained. In short, in the seventh process, the resin structure layer 30 is ground such that the distal end surfaces of the pillars 400 are exposed and the second surface 302 (see FIG. 4C) of the resin structure layer 30 (see FIG. 4C) is flush or substantially flush with the distal end surfaces of the pillars 400. In the seventh process, the distal end surfaces of the pillars 400 are exposed. However, making the distal end surfaces of the pillars 400 and the second surface 302 of the resin structure layer 30 flush or substantially flush with each other is not required. Through the seventh process, a structure including the resin structure 3, the through-wires 4, the electrically insulating portion 7, and the shield portion 6 is formed. In the manufacturing method for the electronic component module 1 according to the first preferred embodiment, the seventh process is a grinding process. The grinding process is performed after the resin molding process. In the grinding process, the resin structure layer 30 is ground such that the distal end surfaces of the pillars 400 are exposed.

In the eighth process, as shown in FIG. 4E, the support 120 and the resin adhesion layer are removed from the structure including the electronic component 2, the resin structure 3, the through-wires 4, the electrically insulating portion 7, the shield portion 6, the support 120, and the resin adhesion layer (not shown). Thus, in the eighth process, the front surface 21 of the electronic component 2, both end surfaces (the first end surface 41 and the second end surface 42) of each through-wire 4, a portion of the electrically insulating portion 7, and a portion of the shield portion 6 can be exposed. In the eighth process, for example, the adhesion of the adhesion layer 124 (see FIG. 4D) bonding the electrically conductive layer 125 (see FIG. 4D) and the base 123 (see FIG. 4D) is decreased, and the base 123 on the support 120 is removed (peeled). The adhesion layer 124 is preferably made from an adhesive of which the adhesion can be decreased by any one of ultraviolet rays, infrared rays, and heat. The electrically conductive layer 125 can be removed by, for example, wet etching. Alternatively, in the eighth process, the resin adhesion layer can be removed by exposing the resin adhesion layer to light and then developing the resin adhesion layer. In the manufacturing method for the electronic component module 1 according to the first preferred embodiment, the eighth process is a removing process of removing the support 120.

Figure 4F:
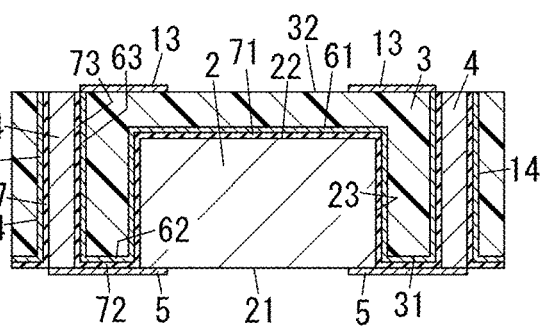

In the ninth process, as shown in FIG. 4F, the plurality of wiring layers 5 each electrically connecting the electronic component 2 to the associated through-wire 4 is formed. In the ninth process, the wiring layers 5 are formed using, for example, sputtering or plating, a photolithography technique, and an etching technique. In the manufacturing method for the electronic component module 1 according to the first preferred embodiment, the ninth process is a wiring layer forming process. In the wiring layer forming process, the wiring layers 5 each electrically connecting the electronic component 2 to the associated through-wire 4 are formed.

Also, in the ninth process, as shown in FIG. 4F, the plurality of second grounding wiring layers 13 are formed. In the ninth process, the second grounding wiring layers 13 are formed using, for example, sputtering or plating, a photolithography technique, and an etching technique.

Figure 5A:
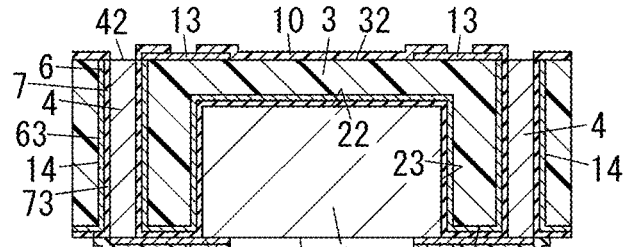
FIGS. 5A to 5D are process cross-sectional views for illustrating a manufacturing method for the electronic component module shown in FIG. 1A.

In the tenth process, as shown in FIG. 5A, the first resist layers 9 and the second resist layer 10 are formed. In the tenth process, the first resist layers 9 and the second resist layer 10 are formed using, for example, a coating technique, such as spin coating, and a photolithography technique.

Figure 5B:
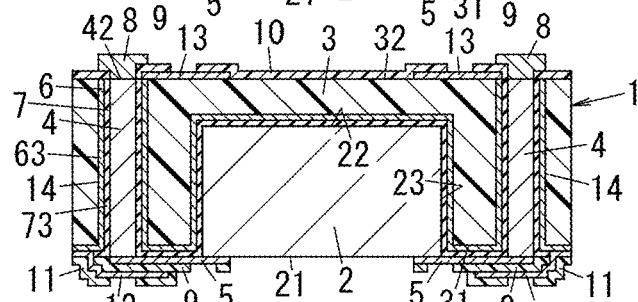

In the eleventh process, as shown in FIG. 5B, each of the plurality of electrodes 8 that are in a one-to-one correspondence with the plurality of through-wires 4 is formed on the second end surface 42 of an associated one of the plurality of through-wires 4. More specifically, in the eleventh process, the electrodes 8 are formed using, for example, a thin film forming technique, such as sputtering, a photolithography technique, and an etching technique.

Also, in the eleventh process, as shown in FIG. 5B, the first grounding wiring layers 12 are formed, and then the third resist layers 11 are formed. More specifically, in the eleventh process, the first grounding wiring layers 12 are each formed on the associated first resist layer 9 using, for example, a thin film forming technique, such as sputtering, a photolithography technique, and an etching technique. After that, in the eleventh process, the third resist layers 11 are each formed using, for example, a coating technique, such as spin coating, and a photolithography technique.

In the manufacturing method for the electronic component module 1 according to the first preferred embodiment, when the support 120 having a size that an aggregate of a plurality of the electronic component modules 1 can be formed is used as the support 120 in the first process, the aggregate of the plurality of electronic component modules 1 can be formed by performing the first process to the eleventh process. In this case, the plurality of electronic component modules 1 can be obtained by, for example, cutting the aggregate of the plurality of electronic component modules 1 into the individual electronic component modules 1 with a dicing machine.

In manufacturing a communication module 200 (see FIG. 5D) including the electronic component module 1, a plurality of the communication modules 200 can be obtained by, after the eleventh process, performing the following twelfth process and thirteenth process and then separating the communication modules 200 into the individual communication modules 200.

Figure 5C:
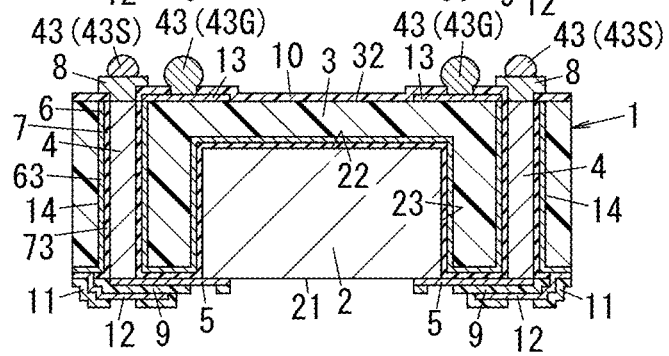
Figure 5D:
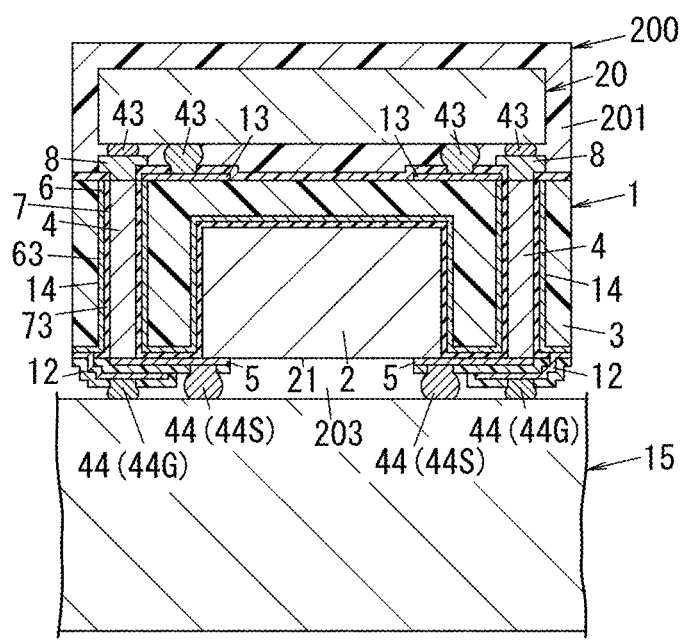

In the twelfth process, as shown in FIG. 5C, the electrically conductive bumps 43 are formed on the electronic component module 1. After that, in the thirteenth process, as shown in FIG. 5D, the terminal electrodes of the electronic component 20 and the electrodes 8 of the electronic component module 1 are electrically and mechanically connected via the electrically conductive bumps 43 (43S), and the grounding electrodes of the electronic component 20 and the second grounding wiring layers 13 of the electronic component module 1 are electrically and mechanically connected via the electrically conductive bumps 43 (43G). After that, in the thirteenth process, a cover layer 201 that covers the electronic component 20 is formed. For example, polyimide resin, benzocyclobutene, polybenzoxazole, phenolic resin, silicone resin, or epoxy resin may preferably be used as the material of the cover layer 201. The cover layer 201 defines and functions as a sealing layer that seals the electronic component 20 on the electronic component module 1. In the thirteenth process, after the cover layer 201 is formed, the electrically conductive bumps 44 (44S) that are electrically connected to the wiring layers 5 of the electronic component module 1 and the electrically conductive bumps 44 (44G) that are electrically connected to the first grounding wiring layers 12 are formed. The above-described electrically conductive bumps 43, 44 are solder bumps. The electrically conductive bumps 43, 44 are not limited to solder bumps and may be, for example, gold bumps.

In the thirteenth process, for example, after the electrically conductive bumps 44 are formed, the communication modules 200 are separated into the individual communication modules 200. After that, as shown in FIG. 5D, the communication module 200 is mounted on the circuit board 15. In the communication module 200, the gap 203 is provided between the front surface 21 of the electronic component 2 and the circuit board 15.

(4) Advantageous Effects

In the electronic component module 1 according to the above-described first preferred embodiment, in the shield portion 6, the first conductor layer 61 provided between the electronic component 2 and the resin structure 3 and the second conductor layer 62 provided between the wiring layers 5 and the resin structure 3 are integrated. Thus, since no interface is provided between the first conductor layer 61 and the second conductor layer 62 in the shield portion 6, the shield portion 6 is not likely to be degraded, so degradation of electromagnetic shielding performance for blocking electromagnetic waves from the outside can be reduced. In other words, long-term reliability of electromagnetic shielding performance for blocking electromagnetic waves from the outside can be improved. Here, the phrase "the first conductor layer 61 and the second conductor layer 62 are integrally formed" means that the first conductor layer 61 and the second conductor layer 62 are formed in a continuous state from the same material. The phrase "the first conductor layer 61 and the second conductor layer 62 are integrated" means that the first conductor layer 61 and the second conductor layer 62 are made from the same material in a continuous state.

In addition, in the electronic component module 1 according to the first preferred embodiment, the shield portion 6 is also provided between the resin structure 3 and the through-wires 4. Thus, the influence of electromagnetic waves from the outside on the through-wires 4 can be reduced.

Furthermore, in the electronic component module 1 according to the first preferred embodiment, the first conductor layer 61 between the electronic component 2 and the resin structure 3, the second conductor layer 62 between the wiring layers 5 and the resin structure 3, and each third conductor layer 63 between the associated through-wire 4 and the resin structure 3 are integrated. Thus, since no interface is provided between the second conductor layer 62 and each third conductor layer 63 in the shield portion 6, the shield portion 6 is unlikely to be degraded, so degradation of electromagnetic shielding performance for blocking electromagnetic waves from the outside can be further reduced.

In the electronic component module 1 according to the first preferred embodiment, the shield portion 6 is provided between each through-wire 4 and the resin structure 3 so as to surround the side surface of the through-wire 4 in a state spaced away from the side surface of the through-wire 4. In addition, the electronic component module 1 according to the first preferred embodiment has the coaxial structures 14 each including the through-wire 4 and the third conductor layer 63 of the shield portion 6. Thus, the through-wires 4 can be further insusceptible to electromagnetic waves from the outside, and propagation losses of radio-frequency signals passing through the through-wires 4 can be reduced. In other words, characteristic degradation due to the influence of electromagnetic waves from the outside can be reduced.

In the manufacturing method for the electronic component module 1 according to the first preferred embodiment, the first conductor layer 61 that covers the first intermediate layer 71 of the electrically insulating portion 7, covering the electronic component 2, and the second conductor layer 62 that covers the second intermediate layer 72 of the electrically insulating portion 7, covering the wiring layers 5, are integrally formed. In the shield portion forming process, the first conductor layer 61 and the second conductor layer 62 are integrally formed by forming the first conductor layer 61 and the second conductor layer 62 substantially at the same time in one process from the same material. Thus, since the shield portion 6 in which no interface is formed between the first conductor layer 61 and the second conductor layer 62 can be formed, the shield portion 6 is unlikely to be degraded, so degradation of electromagnetic shielding performance for blocking electromagnetic waves from the outside can be reduced. In other words, the electronic component module 1 that reduces degradation of electromagnetic shielding performance for blocking electromagnetic waves from the outside can be manufactured.

In the manufacturing method for the electronic component module 1 according to the first preferred embodiment, the first conductor layer 61 that covers the first intermediate layer 71 of the electrically insulating portion 7, covering the electronic component 2, the second conductor layer 62 that covers the second intermediate layer 72 of the electrically insulating portion 7, covering the wiring layers 5, and the third conductor layers 63 each covering the third intermediate layer 73 of the electrically insulating portion 7, covering the pillar 400, are integrally formed. In the shield portion forming process, the first conductor layer 61, the second conductor layer 62, and the third conductor layers 63 are integrally formed by forming the first conductor layer 61, the second conductor layer 62, and the third conductor layers 63 substantially at the same time in one process from the same material. Thus, since the shield portion 6 in which no interface is formed between the second conductor layer 62 and each third conductor layer 63 can be formed, the shield portion 6 is unlikely to be degraded, so degradation of electromagnetic shielding performance for blocking electromagnetic waves from the outside can be further reduced.

(5) Modifications (5.1) First Modification

Figure 6:
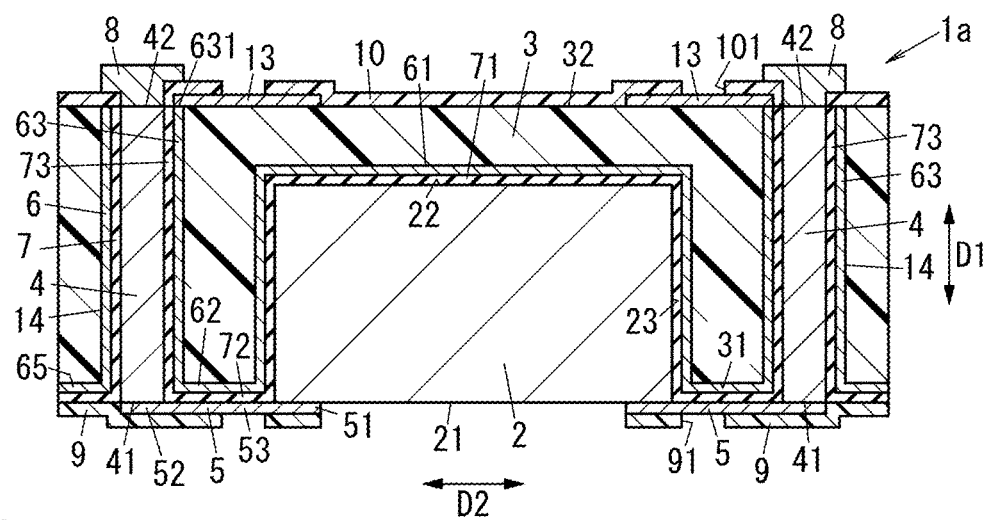
FIG. 6 is a cross-sectional view of an electronic component module according to a first modification of the first preferred embodiment of the present invention.

As shown in FIG. 6, an electronic component module 1a according to a first modification of the first preferred embodiment differs from the electronic component module 1 according to the first preferred embodiment in that the first grounding wiring layers 12 and the third resist layers 11 in the electronic component module 1 (see FIG. 1A) according to the first preferred embodiment are not provided. As for the electronic component module 1a according to the first modification, the same reference numerals denote the same or similar elements to those of the electronic component module 1 according to the first preferred embodiment, and the description thereof is omitted.

In the electronic component module 1a according to the first modification, the first grounding wiring layers 12 and the third resist layers 11 are not provided, so manufacturing is facilitated as compared to the electronic component module 1 of the first preferred embodiment.

(5.2) Second Modification

Figure 7:
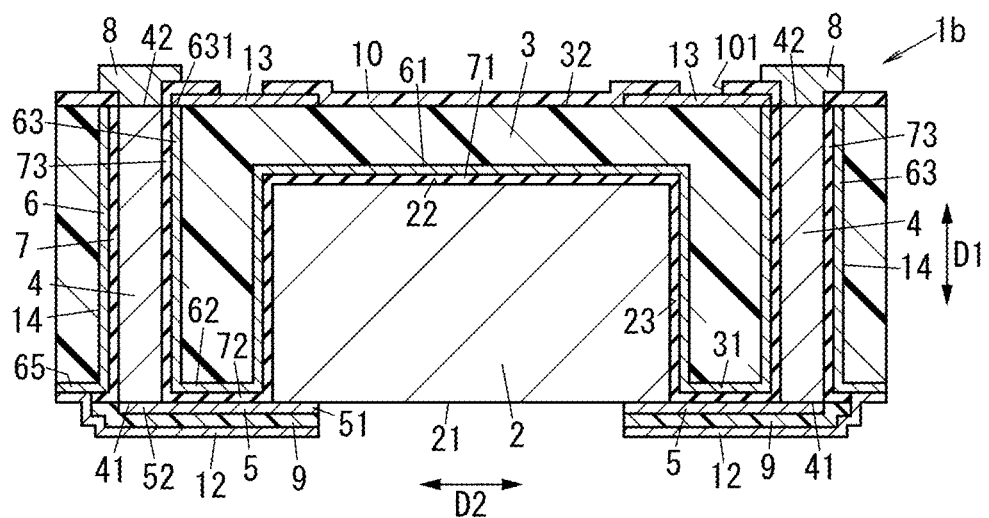
FIG. 7 is a cross-sectional view of an electronic component module according to a second modification of the first preferred embodiment of the present invention.

As shown in FIG. 7, an electronic component module 1b according to a second modification of the first preferred embodiment differs from the electronic component module 1 according to the first preferred embodiment in that the first resist layers 9 each cover the entire or substantially the entire wiring layer 5 and the first grounding wiring layers 12 each cover the entire or substantially the entire first resist layer 9. As for the electronic component module 1b according to the first modification, the same reference numerals denote the same or similar elements to those of the electronic component module according to the first preferred embodiment, and the description thereof is omitted.

With the electronic component module 1b according to the second modification, radio-frequency signals that pass through the wiring layers 5 are insusceptible to electromagnetic waves from the outside of the electronic component module 1. Thus, with the electronic component module 1b according to the second modification, further improved characteristics are obtained. A manufacturing method for the electronic component module 1b according to the second modification is similar to the manufacturing method for the electronic component module 1 according to the first preferred embodiment, and only the pattern of a photomask at the time of forming the first resist layers 9 and the pattern of a photomask at the time of forming the first grounding wiring layers 12 are varied.

(5.3) Third Modification

Figure 8:
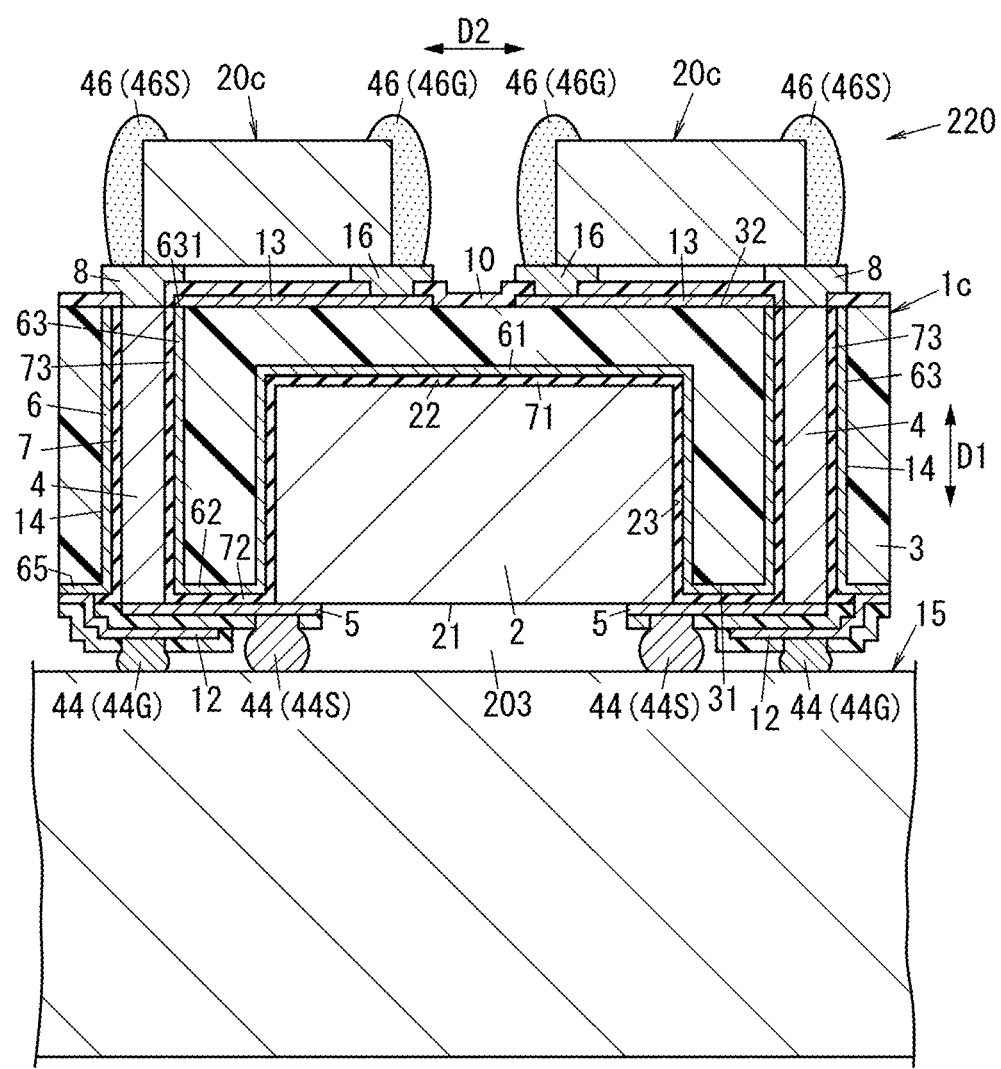
FIG. 8 is a cross-sectional view of an electronic component module according to a third modification of the first preferred embodiment of the present invention.

As shown in FIG. 8, an electronic component module 1c according to a third modification of the first preferred embodiment differs from the electronic component module 1 according to the first preferred embodiment in that the overall length (wiring length) of each second grounding wiring layer 13 in the second direction D2 is elongated so that two electronic components 20c arranged in the second direction D2 can be mounted. In addition, the electronic component module 1c according to the third modification differs from the electronic component module 1 according to the first preferred embodiment in that electrodes 16 are formed in a region not covered with the second resist layer 10 in the second grounding wiring layers 13. As for the electronic component module 1c according to the third modification, the same reference numerals denote the same or similar elements to those of the electronic component module 1 according to the first preferred embodiment, and the description thereof is omitted.

In a communication module 220 including the electronic component module 1c according to the third modification and the two electronic components 20c, each electronic component 20c is electrically and mechanically connected to the electronic component module 1c by bonding the terminal electrode of each electronic component 20c to the electrode 8 of the electronic component module 1c by the bonding portion 46 (46S), and each electronic component 20c is electrically and mechanically connected to the electronic component module 1c by bonding the ground electrode of each electronic component 20c to the electrode 16 of the electronic component module 1c by the bonding portion 46 (46G). The bonding portions 46 are made from an electrically conductive adhesive (for example, conductive paste). The communication module 220 includes the circuit board 15. However, in the communication module 220, the circuit board 15 is not required.

With the communication module 220, interference due to electromagnetic waves between the electronic component module 1c and each electronic component 20c can be reduced or prevented.

A manufacturing method for the electronic component module 1c according to the third modification is similar to the manufacturing method for the electronic component module 1 according to the first preferred embodiment, and differs in that the electrodes 16 are also formed at the time of forming the electrodes 8.

(5.4) Other Modifications

In the electronic component module 1 according to the first preferred embodiment, the second surface 32 of the resin structure 3 has a planar shape, and a shortest distance from the second surface 32 of the resin structure 3 to the front surface 21 of the electronic component 2 is longer than a shortest distance from the second surface 32 to the first surface 31. Thus, with the electronic component module 1 according to the first preferred embodiment, a low profile configuration is achieved.

In contrast to this, as a modification of the first preferred embodiment, the second surface 32 of the resin structure 3 may have a planar shape, and a distance from the second surface 32 of the resin structure 3 to the front surface 21 of the electronic component 2 may be shorter than a distance from the second surface 32 of the resin structure 3 to the first surface 31 of the resin structure 3. Thus, with the electronic component module 1 according to this modification, flaws are difficult to be formed on the front surface 21 of the electronic component 2.

Alternatively, as another modification of the first preferred embodiment, the second surface 32 of the resin structure 3 may have a planar shape, and a distance from the second surface 32 of the resin structure 3 to the front surface 21 of the electronic component 2 may be equal or substantially equal to a distance from the second surface 32 of the resin structure 3 to the first surface 31 of the resin structure 3.

In short, the resin structure 3 only needs to cover at least a portion of the side surface 23 of the electronic component 2. The phrase "cover at least a portion of the side surface 23 of the electronic component 2" means that, as for the side surface 23 of the electronic component 2, the side surface 23 is at least covered all around from a position, shifted from the front surface 21-side first end of the side surface 23 of the electronic component 2 toward the back surface 22-side second end side, to the boundary between the side surface 23 and the back surface 22, and includes the case where the entire or substantially entire side surface 23 of the electronic component 2 is covered.

The first conductor layer 61 is not limited to the case where the first conductor layer 61 covers the entire or substantially the entire surface of the first intermediate layer 71, and, for example, one or a plurality of holes may be provided in the first conductor layer 61.

In the example of FIG. 1A, for the single electronic component 2, the electronic component module 1 includes the two wiring layers 5 directly connected to the electronic component 2. However, the number of the wiring layers 5 is not limited to two. The number of the wiring layers 5 may be one or may be three or more. In addition, the number of the through-wires 4 is not limited to two. The number of the through-wires 4 may be one or may be three or more. In the electronic component module 1, when the plurality of through-wires 4 are, for example, arranged in a direction (third direction) perpendicular or substantially perpendicular to the first direction D1 and the second direction D2, the plurality of coaxial structures 14 are also arranged in the third direction, so a distance between any adjacent through-wires 4 in the third direction can be reduced.

In the electronic component module 1, the first intermediate layer 71 between each through-wire 4 and the first conductor layer 61 is the electrically insulating layer. However, the first intermediate layer is not limited to the electrically insulating layer. In the electronic component module 1, the first intermediate layer may be an air layer. When the first intermediate layer 71 is an air layer, a sacrificial layer interposed between each through-wire 4 and the first conductor layer 61 is removed by etching in manufacturing the electronic component module 1. In the manufacturing method for the electronic component module 1, the sacrificial layer in this case is the first intermediate layer defined by the electrically insulating layer that is formed in the intermediate layer forming process. The sacrificial layer is not limited to the case where the sacrificial layer is made of a material having an electrically insulating property, and may be made of a material having an electrical conductivity.

With the electronic component modules 1 according to the above-described modifications as well, the same or similar advantageous effects to those of the electronic component module 1 according to the first preferred embodiment are obtained.

Second Preferred Embodiment

Figure 9:
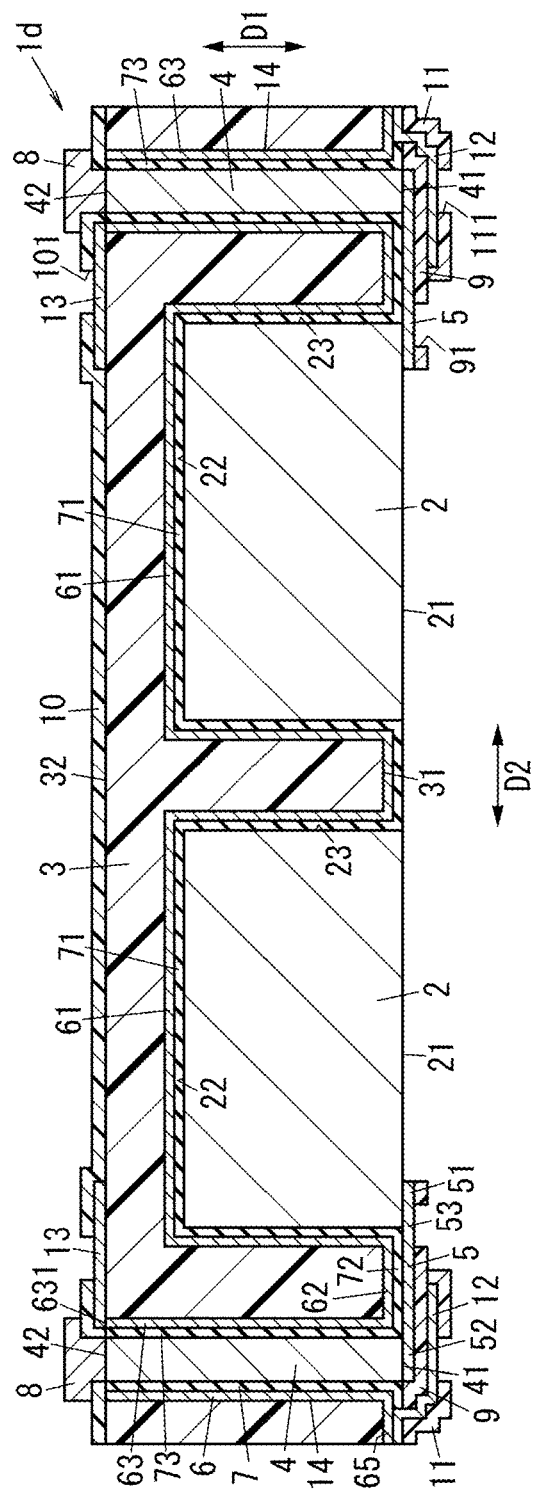
FIG. 9 is a cross-sectional view of an electronic component module according to a second preferred embodiment of the present invention.

As shown in FIG. 9, an electronic component module 1d according to the second preferred embodiment differs from the electronic component module 1 (see FIG. 1A) according to the first preferred embodiment in that a plurality of (two in the illustrated example) the electronic components 2 are provided. As for the electronic component module 1d according to the second preferred embodiment, the same reference numerals denote the same or similar elements to those of the electronic component module 1 according to the first preferred embodiment, and the description thereof is omitted.

A non-limiting example of a manufacturing method for the electronic component module 1d according to the second preferred embodiment differs from the manufacturing method for the electronic component module 1 according to the first preferred embodiment in that a plurality of the electronic components 2 are disposed in the component disposing process.

With the electronic component module 1d according to the second preferred embodiment, the side surface 23 of each electronic component 2 is covered with the first conductor layer 61 via the first intermediate layer 71, so interference due to electromagnetic waves between the adjacent two electronic components 2 can be prevented. Thus, with the electronic component module 1d according to the second preferred embodiment, a distance between the adjacent two electronic components 2 can be further reduced, so miniaturization of the configuration including a plurality of the electronic components 2 is possible.

The plurality of electronic components 2 may be electronic components of the same type or may be electronic components of different types. The number of the electronic components 2 is not limited to two and may be three or more. When the number of the electronic components 2 is three or more, only a portion of the electronic components 2 may be electronic components of the same type. When the electronic component module 1 includes the plurality of electronic components 2, the layout of the through-wires 4 and the wiring layers 5 may be varied among the electronic components 2.

Third Preferred Embodiment

Figure 10:
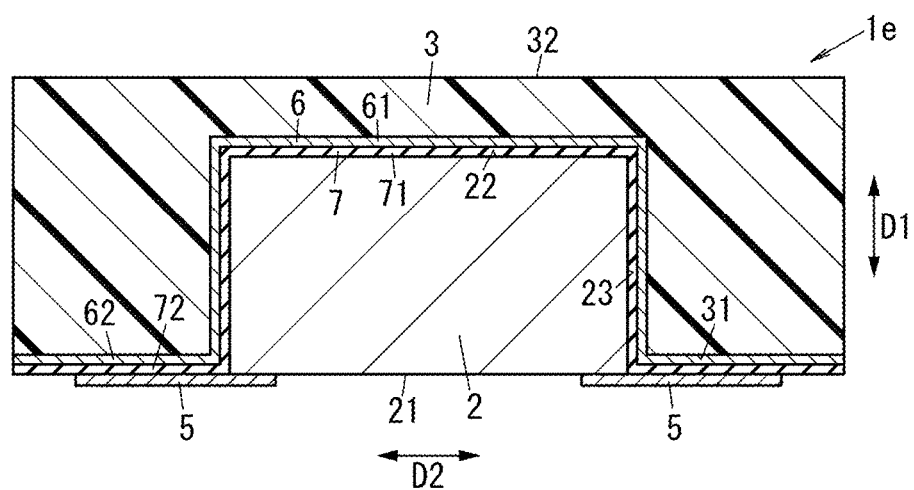
FIG. 10 is a cross-sectional view of an electronic component module according to a third preferred embodiment of the present invention.

As shown in FIG. 10, an electronic component module 1e according to the third preferred embodiment differs from the electronic component module 1 according to the first preferred embodiment in that the through-wires 4 in the electronic component module 1 (see FIG. 1A) according to the first preferred embodiment are not provided. As for the electronic component module 1e according to the third preferred embodiment, the same reference numerals denote the same or similar elements to those of the electronic component module 1 according to the first preferred embodiment, and the description thereof is omitted.

As shown in FIG. 10, the electronic component module 1e according to the third preferred embodiment, as well as the electronic component module 1 according to the first preferred embodiment, includes the electronic component 2, the resin structure 3, the plurality of (two in the illustrated example) wiring layers 5, the electrically conductive shield portion 6, and the electrically insulating portion 7 having an electrically insulating property.

The electrically insulating portion 7 of the third preferred embodiment has an electrically insulating property. The electrically insulating portion 7 includes the first intermediate layer 71 and the second intermediate layer 72. The description of similar components and functions to those of the electrically insulating portion 7 (see FIG. 1A) of the first preferred embodiment is omitted.

The shield portion 6 of the third preferred embodiment, as well as the shield portion 6 (see FIG. 1A) of the first preferred embodiment, is provided as a shield layer providing electromagnetic shielding. The shield portion 6 includes the first conductor layer 61 and the second conductor layer 62. The first conductor layer 61 and the second conductor layer 62 are integrated. The description of similar components and functions to those of the shield portion 6 of the first preferred embodiment is omitted.

Next, a manufacturing method for the electronic component module 1e according to the third preferred embodiment will be described with reference to FIGS. 11A to 11D, and FIGS. 12A to 12D.

In the manufacturing method for the electronic component module 1e according to the third preferred embodiment, after the electronic component 2 is prepared, the first process to the eighth process are performed sequentially. The manufacturing method for the electronic component module 1e according to the third preferred embodiment differs from the manufacturing method for the electronic component module 1 according to the first preferred embodiment in that the pillar forming process is not provided.

Figure 11A:
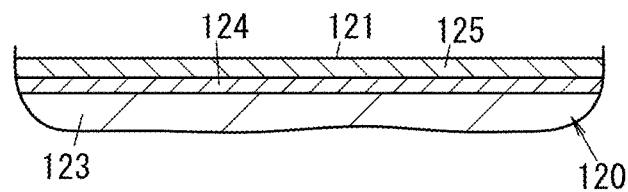
FIGS. 11A to 11D are process cross-sectional views for illustrating a manufacturing method for the electronic component module shown in FIG. 10.

The first process of the third preferred embodiment is similar to the first process of the first preferred embodiment. In the first process, as shown in FIG. 11A, the support 120 is prepared.

Figure 11B:
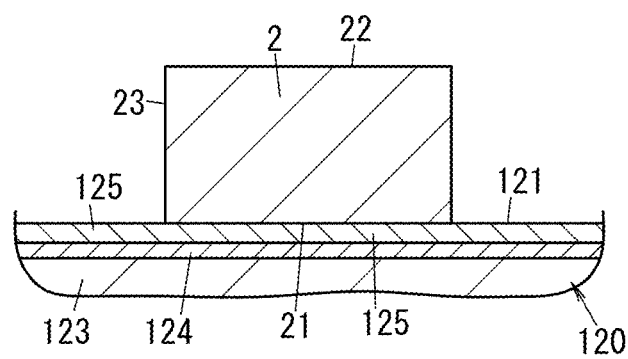

In the second process, as well as the third process of the first preferred embodiment, as shown in FIG. 11B, the electronic component 2 is temporarily fixed on the electrically conductive layer 125 of the support 120. In the manufacturing method for the electronic component module 1e according to the third preferred embodiment, the second process is the component disposing process.

Figure 11C:
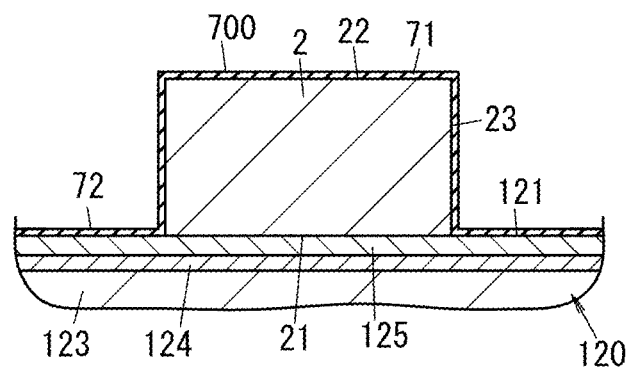

In the third process, as well as the fourth process of the first preferred embodiment, as shown in FIG. 11C, the electrically insulating layer 700 that defines the electrically insulating portion 7 is formed. In the manufacturing method for the electronic component module 1e according to the third preferred embodiment, the third process is the intermediate portion forming process.

Figure 11D:
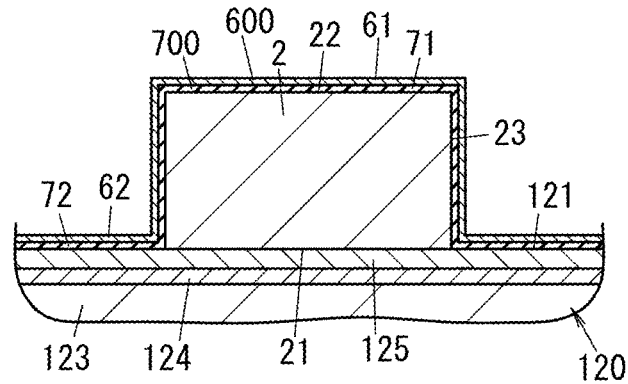

In the fourth process, as well as the fifth process of the first preferred embodiment, as shown in FIG. 11D, the metal layer 600 that defines the shield portion 6 is formed. More specifically, in the fourth process, the metal layer 600 is formed on the electrically insulating layer 700. In the fourth process, the metal layer 600 is formed by, for example, CVD. Thus, in the fourth process, the first conductor layer 61 and the second conductor layer 62 can be integrally formed. In the manufacturing method for the electronic component module 1e according to the third preferred embodiment, the fourth process is the shield portion forming process.

Figure 12A:
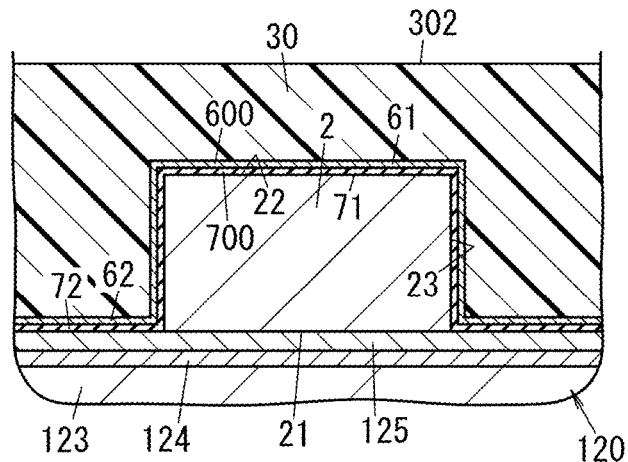
FIGS. 12A to 12D are process cross-sectional views for illustrating a manufacturing method for the electronic component module shown in FIG. 10.

In the fifth process, as well as the sixth process of the first preferred embodiment, as shown in FIG. 12A, the resin structure layer 30 that defines the resin structure 3 (see FIG. 12C) is formed on the support 120. In the fifth process, the resin structure layer 30 is formed on the support 120 so as to cover the metal layer 600 covering the electrically insulating layer 700.

In the manufacturing method for the electronic component module 1e according to the third preferred embodiment, the fifth process is the resin molding process.

Figure 12B:
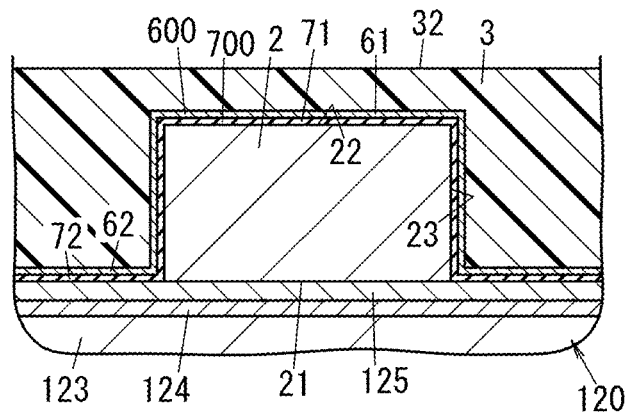

In the sixth process, as well as the seventh process of the first preferred embodiment, as shown in FIG. 12B, the resin structure 3 is formed by grinding the resin structure layer 30 from the second surface 302 side until the thickness of the resin structure 3 is obtained. In the third preferred embodiment, the sixth process is not a required process. Alternatively, the sixth process may be omitted, and, after the fifth process is performed, the seventh process may be performed.

Figure 12C:
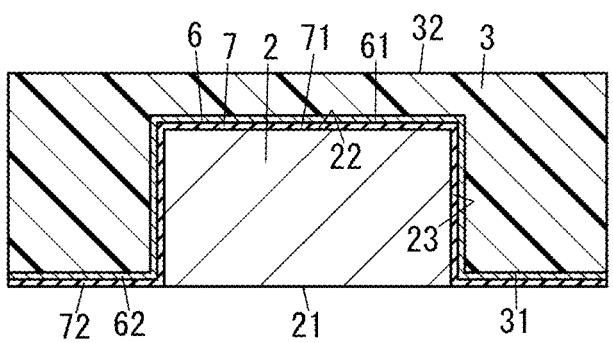

In the seventh process, as well as the eighth process of the first preferred embodiment, as shown in FIG. 12C, the support 120 and the resin adhesion layer are removed from the structure including the electronic component 2, the resin structure 3, the electrically insulating portion 7, the shield portion 6, the support 120, and the resin adhesion layer (not shown).

Figure 12D:
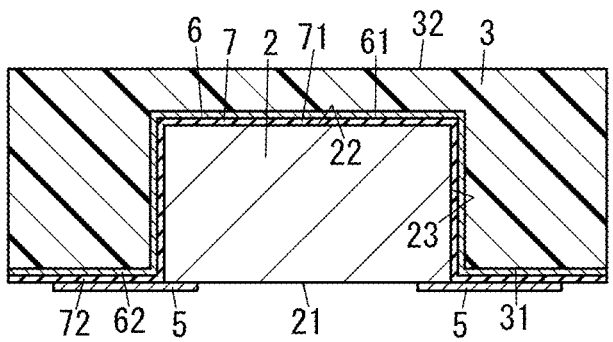

In the eighth process, as well as the ninth process of the first preferred embodiment, as shown in FIG. 12D, the plurality of wiring layers 5 are formed. In the manufacturing method for the electronic component module 1e according to the third preferred embodiment, the eighth process is the wiring layer forming process.

As described above, in the electronic component module 1e according to the third preferred embodiment, as well as the electronic component module 1 according to the first preferred embodiment, in the shield portion 6, the first conductor layer 61 provided between the electronic component 2 and the resin structure 3 and the second conductor layer 62 provided between the wiring layers 5 and the resin structure 3 are integrated. Thus, since no interface is formed between the first conductor layer 61 and the second conductor layer 62 in the shield portion 6, the shield portion 6 is unlikely to be degraded, so degradation of electromagnetic shielding performance for blocking electromagnetic waves from the outside can be reduced.

The above-described first to third preferred embodiments are each one of various preferred embodiments of the present invention. The first to third preferred embodiments each may be modified into various ways according to design, or the like, as long as the advantageous effects of preferred embodiments of the present invention are achieved.

It is apparent from the above-described preferred embodiments that the following aspects are disclosed.

An electronic component module (1; 1a; 1b; 1c; 1d; 1e) according to a preferred embodiment of the present invention includes an electronic component (2), a resin structure (3), a wiring portion (wiring layer 5), and a shield portion (6). The electronic component (2) includes a first main surface (front surface 21) and a second main surface (back surface 22) opposed to each other, and a side surface (23) connecting the first main surface and the second main surface. The resin structure (3) covers the second main surface and at least a portion of the side surface (23) of the electronic component (2). The wiring portion is electrically connected to the electronic component (2). The shield portion (6) includes a first conductor layer (61) and a second conductor layer (62). The first conductor layer (61) is spaced away from the electronic component (2) between the electronic component (2) and the resin structure (3), and has electrical conductivity. The second conductor layer (62) is spaced away from the wiring portion between the wiring portion and the resin structure (3), and has electrical conductivity. In the shield portion (6), the first conductor layer (61) and the second conductor layer (62) are integrated.

In an electronic component module (1; 1a; 1b; 1c; 1d; 1e) according to a preferred embodiment of the present invention, in the shield portion (6), the first conductor layer (61) provided between the electronic component (2) and the resin structure (3) and the second conductor layer (62) provided between the wiring portion (wiring layer 5) and the resin structure (3) are integrated. Thus, since no interface is provided between the first conductor layer (61) and the second conductor layer (62) in the shield portion (6), the shield portion (6) is unlikely to be degraded, so degradation of electromagnetic shielding performance for blocking electromagnetic waves from the outside can be reduced.

In an electronic component module (1; 1a; 1b; 1c; 1d; 1e) according to a preferred embodiment of the present invention, in the shield portion (6), the first conductor layer (61) and the second conductor layer (62) are made of the same material and are continuous.

An electronic component module (1; 1a; 1b; 1c; 1d) according to a preferred embodiment of the present invention, further includes a through-wire (4). The through-wire (4) extends through the resin structure (3). The shield portion (6) further includes a third conductor layer (63). The third conductor layer (63) is spaced away from the through-wire (4) between the through-wire (4) and the resin structure (3).

In an electronic component module (1; 1a; 1b; 1c; 1d) according to a preferred embodiment of the present invention, the shield portion (6) is also provided between the resin structure (3) and the through-wire (4). Thus, the influence of electromagnetic waves from the outside on the through-wire (4) can be reduced.

In an electronic component module (1; 1a; 1b; 1c; 1d) according to a preferred embodiment of the present invention, in the shield portion (6), the first conductor layer (61), the second conductor layer (62), and the third conductor layer (63) are integrated.

In an electronic component module (1; 1a; 1b; 1c; 1d) according to a preferred embodiment of the present invention, the first conductor layer (61) between the electronic component (2) and the resin structure (3), the second conductor layer (62) between the wiring portion (wiring layer 5) and the resin structure (3), and the third conductor layer (63) between the through-wire (4) and the resin structure (3) are integrated. Thus, since no interface is provided between the second conductor layer (62) and the third conductor layer (63) in the shield portion (6), the shield portion (6) is unlikely to be degraded, so degradation of electromagnetic shielding performance for blocking electromagnetic waves from the outside can be further reduced.

In an electronic component module (1; 1a; 1b; 1c; 1d) according to a preferred embodiment of the present invention, the third conductor layer (63) of the shield portion (6) surrounds the side surface of the through-wire (4) and is spaced away from the side surface of the through-wire (4) between the through-wire (4) and the resin structure (3).

In an electronic component module (1; 1a; 1b; 1c; 1d) according to a preferred embodiment of the present invention, the shield portion (6) is provided between the through-wire (4) and the resin structure (3) so as to surround the side surface of the through-wire (4) in a state spaced away from the side surface of the through-wire (4). Thus, the influence of electromagnetic waves from the outside on the through-wire (4) can be further reduced.

An electronic component module (1; 1a; 1b; 1c; 1d) according to a preferred embodiment of the present invention has a coaxial structure (14) including the through-wire (4) and the third conductor layer (63).

In an electronic component module (1; 1a; 1b; 1c; 1d) according to a preferred embodiment of the present invention, the coaxial structure (14) includes the through-wire (4) and the third conductor layer (63). Thus, the through-wire (4) can be further insusceptible to electromagnetic waves from the outside, and propagation losses of radio-frequency signals that pass through the through-wire (4) can be reduced. In other words, characteristic degradation due to the influence of electromagnetic waves from the outside can be reduced.

An electronic component module (1; 1a; 1b; 1c; 1d; 1e) according to a preferred embodiment of the present invention further includes an intermediate portion (electrically insulating portion 7). The intermediate portion is interposed between the shield portion (6) and at least one of the electronic component (2) and the wiring portion (wiring layer 5) and has an electrically insulating property.

In an electronic component module (1; 1a; 1b; 1c; 1d; 1e) according to a preferred embodiment of the present invention, the intermediate portion (electrically insulating portion 7) having an electrically insulating property is provided between the shield portion (6) and at least one of the electronic component (2) and the wiring portion (wiring layer 5). Thus, while the electrically insulating property is ensured between the shield portion (6) and at least one of the electronic component (2) and the wiring portion, the entire electronic component module (1; 1a; 1b; 1c; 1d; 1e) can be stably provided as compared to when there is a gap between the shield portion (6) and at least one of the electronic component (2) and the wiring portion.

In an electronic component module (1; 1a; 1b; 1c; 1d; 1e) according to a preferred embodiment of the present invention, a dielectric constant of the intermediate portion (electrically insulating portion 7) is lower than a dielectric constant of the resin structure (3).

In an electronic component module (1; 1a; 1b; 1c; 1d; 1e) according to a preferred embodiment of the present invention, the dielectric constant of the intermediate portion (electrically insulating portion 7) is lower than the dielectric constant of the resin structure (3). Thus, with the electronic component module (1; 1a; 1b; 1c; 1d; 1e), a parasitic capacitance that occurs between the shield portion (6) and at least one of the electronic component (2) and the wiring portion (wiring layer 5) can be reduced.

In an electronic component module (1; 1a; 1b; 1c; 1d; 1e) according to a preferred embodiment of the present invention, the electronic component (2) is a radio-frequency device having a frequency band of about 5 GHz or higher.

A manufacturing method for an electronic component module (1; 1a; 1b; 1c; 1d; 1e) according to a preferred embodiment of the present invention includes a component disposing process, an intermediate portion forming process, and a resin molding process. In the component disposing process, an electronic component (2) is disposed on a surface (121) of a support (120) such that a front surface (21) of the electronic component (2) faces the surface (121) of the support (120). The electronic component (2) includes a first main surface (front surface 21) and a second main surface (back surface 22) opposed to each other, and a side surface (23) connecting the first main surface and the second main surface. In the intermediate portion forming process, an intermediate portion (electrically insulating portion 7) covering an exposed region of the surface (121) of the support (120) and both the second main surface and an exposed region of the side surface (23) of the electronic component (2) is formed. In the shield portion forming process, a shield portion (6) covering the intermediate portion is formed. In the resin molding process, a resin structure (3) covering the shield portion (6) is molded.

In a manufacturing method for an electronic component module (1; 1a; 1b; 1c; 1d; 1e) according to a preferred embodiment of the present invention, a first conductor layer (61) that covers a portion (first intermediate layer 71) of the intermediate portion (electrically insulating portion 7), covering the electronic component (2), and a second conductor layer (62) that covers a portion (second intermediate layer 72) of the intermediate portion, covering the wiring portion (wiring layer 5), are integrally formed. Thus, since the shield portion (6) in which no interface is formed between the first conductor layer (61) and the second conductor layer (62) can be formed, the shield portion (6) is unlikely to be degraded, so degradation of electromagnetic shielding performance for blocking electromagnetic waves from the outside can be reduced.

A manufacturing method for an electronic component module (1; 1a; 1b; 1c; 1d) according to a preferred embodiment of the present invention further includes a pillar forming process. In the pillar forming process, before the intermediate portion (electrically insulating portion 7) is formed, a pillar (400) having electrical conductivity is formed on the surface (121) of the support (120). In the intermediate portion forming process, the intermediate portion covering an exposed region of the pillar (400), an exposed region of the surface (121) of the support (120), and an exposed region of the side surface (23) of the electronic component (2) is formed.

In a manufacturing method for an electronic component module (1; 1a; 1b; 1c; 1d) according to a preferred embodiment of the present invention, the first conductor layer (61) that covers the portion (first intermediate layer 71) of the intermediate portion (electrically insulating portion 7), covering the electronic component (2), the second conductor layer (62) that covers the portion (second intermediate layer 72) of the intermediate portion, covering the wiring portion (wiring layer 5), and a third conductor layer (63) that covers a portion (third intermediate layer 73) of the intermediate portion, covering the pillar (400), are integrally formed. Thus, since the shield portion (6) in which no interface is formed between the second conductor layer (62) and the third conductor layer (63) can be formed, the shield portion (6) is unlikely to be degraded, so degradation of electromagnetic shielding performance for blocking electromagnetic waves from the outside can be further reduced.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An electronic component module comprising:
   an electronic component including a first main surface and a second main surface opposed to each other, and a side surface connecting the first main surface and the second main surface;
   a resin structure covering the second main surface and at least a portion of the side surface of the electronic component;
   a through-wire extending through the resin structure;
   a wiring portion electrically connected to the electronic component; and
   a shield portion including a first conductor layer having electrical conductivity and a second conductor layer having electrical conductivity, the first conductor layer being spaced away from the electronic component between the electronic component and the resin structure, the second conductor layer being spaced away from the wiring portion between the wiring portion and the resin structure, and a third conductor layer spaced away from the through-wire and extending between the through-wire and the resin structure; wherein
   the shield portion, the first conductor layer, and the second conductor layer are integrated.

2. The electronic component module according to claim 1, wherein in the shield portion, the first conductor layer and the second conductor layer are made of a same material and are continuous.

3. The electronic component module according to claim 1, wherein in the shield portion, the first conductor layer, the second conductor layer, and the third conductor layer are integrated.

4. The electronic component module according to claim 1, wherein the third conductor layer of the shield portion surrounds a side surface of the through-wire and is spaced away from the side surface of the through-wire between the through-wire and the resin structure.

5. The electronic component module according to claim 1, wherein the through-wire and the third conductor layer define a coaxial structure.

6. The electronic component module according to claim 1, further comprising an intermediate portion having an electrically insulating property and interposed between the shield portion and at least one of the electronic component and the wiring portion.

7. The electronic component module according to claim 6, wherein a dielectric constant of the intermediate portion is lower than a dielectric constant of the resin structure.

8. The electronic component module according to claim 1, wherein
   the electronic component is a radio-frequency device having a frequency band of about 5 GHz or higher.

9. The electronic component module according to claim 1, wherein
   the electronic component is a radio-frequency device having a frequency band of about 1 GHz or higher.

10. The electronic component module according to claim 1, wherein the electronic component is a surface acoustic wave filter including a piezoelectric substrate including a front surface and a back surface that are opposed to each other, and a functional portion provided on the front surface of the piezoelectric substrate.

11. The electronic component module according to claim 1, wherein the resin structure is made of epoxy resin.

12. The electronic component module according to claim 1, wherein the through-wire has a columnar shape.

13. The electronic component module according to claim 1, wherein the through-wire is made of Cu.

14. The electronic component module according to claim 1, wherein the wiring portion electrically connects the through-wire and the electronic component.

15. The electronic component module according to claim 14, wherein the wiring portion is disposed over the front surface of the electronic component.

* * * * *